United States Patent [19]
Laskaris et al.

[11] Patent Number: 6,043,729
[45] Date of Patent: Mar. 28, 2000

[54] TUBE SUSPENSION ASSEMBLY FOR SUPERCONDUCTIVE MAGNETS

[75] Inventors: Evangelos Trifon Laskaris, Niskayuna; Bruce Campbell Amm, Clifton Park; Somanath Nagendra, Niskayuna, all of N.Y.

[73] Assignee: General Electric Company, Schenectady, N.Y.

[21] Appl. No.: 09/191,289

[22] Filed: Nov. 13, 1998

[51] Int. Cl.[7] ............................... H01F 7/22; F25B 19/00
[52] U.S. Cl. ............................. 335/216; 324/318
[58] Field of Search .................. 335/216, 299; 324/318, 319, 320

[56] References Cited

U.S. PATENT DOCUMENTS

| | | | |
|---|---|---|---|
| 4,935,714 | 6/1990 | Vermilyea | 505/211 |
| 5,446,433 | 8/1995 | Laskaris et al. | 335/216 |
| 5,530,413 | 6/1996 | Minas et al. | 335/216 |
| 5,563,566 | 10/1996 | Laskaris et al. | 335/216 |
| 5,651,256 | 7/1997 | Herd et al. | 62/51.1 |

*Primary Examiner*—Lincoln Donovan
*Assistant Examiner*—Raymond Barrera
*Attorney, Agent, or Firm*—Marvin Snyder; Douglas E. Stoner

[57] ABSTRACT

A superconductive magnet includes a superconductive coil assembly having a cryogenic vessel, a thermal shield enclosing the cryogenic vessel, and a vacuum enclosure enclosing the thermal shield. The cryogenic vessel, thermal shield and vacuum vessel have annular shells radially spaced apart from one another with reference to a common longitudinal axis and coaxially aligned with the common longitudinal axis. The magnet also includes a tube suspension assembly having a plurality of tubes located between respective ones of the cryogenic vessel, thermal shield and vacuum enclosure. The tubes are axially overlapped and are interconnected with one another and with the cryogenic vessel, thermal shield and vacuum enclosure. One tube has an end forming a sliding joint with the cryogenic vessel that allows both radial and axial movement of the cryogenic vessel relative to the thermal shield and vacuum enclosure during cooldown of the cryogenic vessel from ambient to cryogenic temperatures.

10 Claims, 4 Drawing Sheets

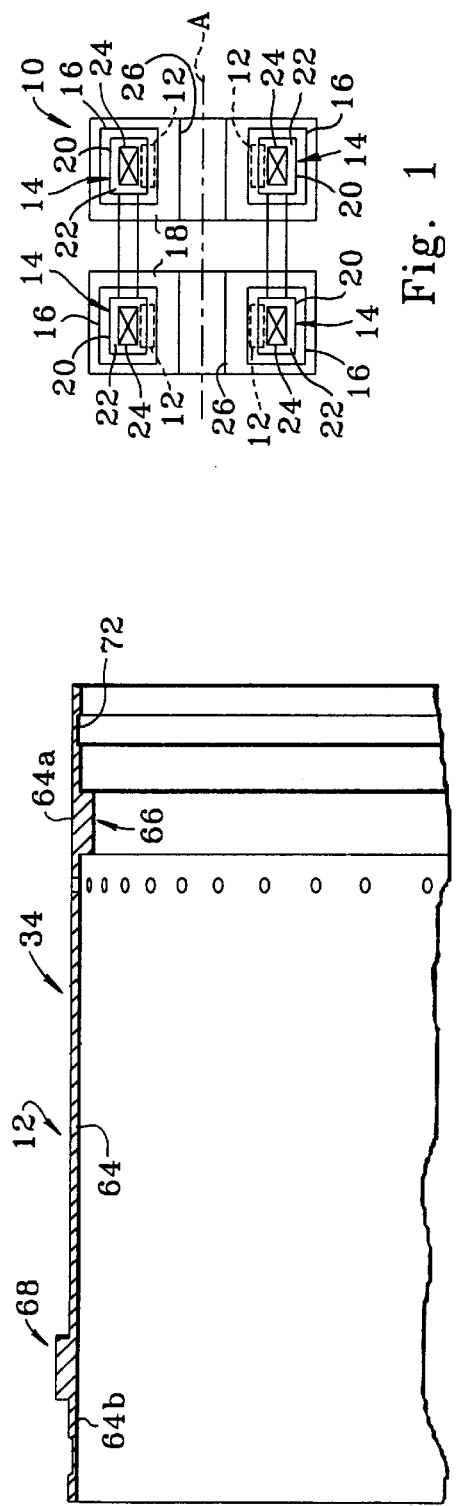
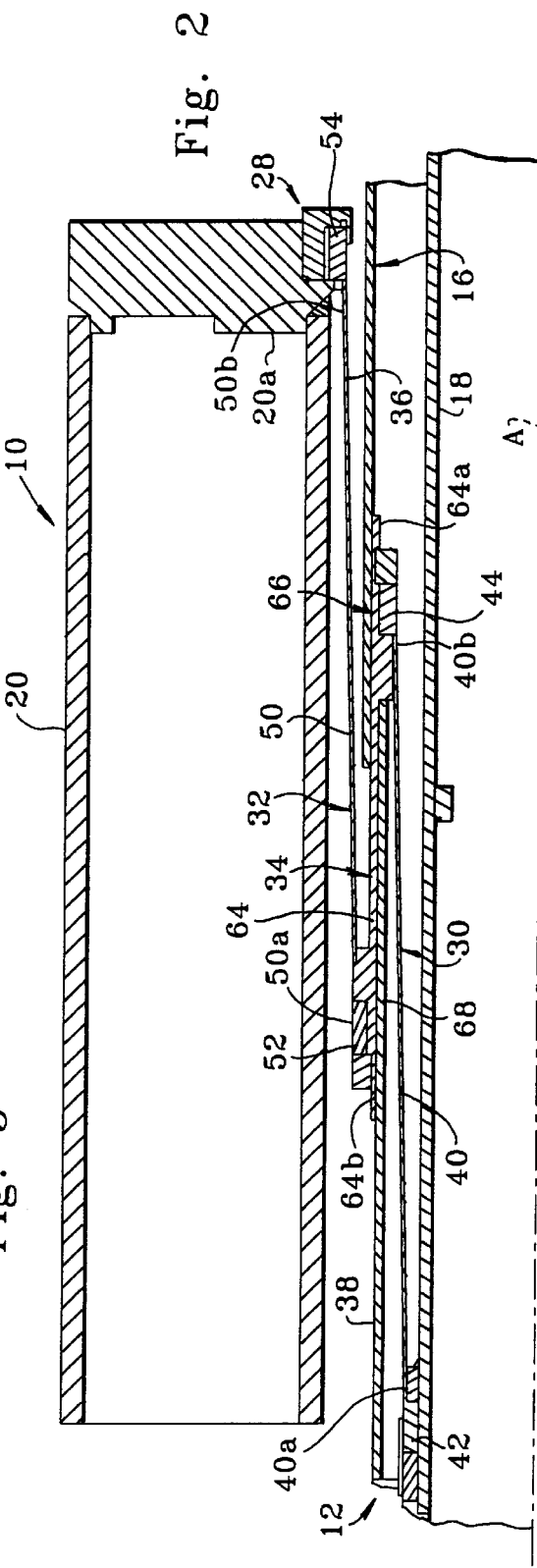
Fig. 1
Fig. 2
Fig. 5

TUBE SUSPENSION ASSEMBLY FOR SUPERCONDUCTIVE MAGNETS

BACKGROUND OF THE INVENTION

The present invention generally relates to tube suspension systems and, more particularly, is concerned with a tube suspension assembly for use in superconductive magnets.

Superconductive magnets include superconductive coils which generate uniform and high strength magnetic fields, such as used, without limitation, in magnetic resonance imaging (MRI) systems employed in the field of medical diagnostics. The superconductive coil assemblies of the magnet are enclosed in a thermal shield surrounded by a vacuum enclosure.

Various designs of tube suspension systems are employed to support the superconductive coil assembly of the magnet from and in spaced apart relation to both the thermal shield and the vacuum enclosure of the magnet. As one example, the tube suspension system can include overlapped fiberglass outer and inner support cylinders, such as disclosed in U.S. Pat. No. 5,530,413 to Minas et al. which is assigned to the same assignee as the present invention. In the Minas et al. suspension system, the outer support cylinder is located within and generally spaced apart from the vacuum enclosure and positioned outside of and generally spaced apart from the thermal shield. A first end of the outer support cylinder is rigidly connected to the vacuum enclosure while a second end of the outer support cylinder is rigidly connected to the thermal shield. The inner support cylinder is located within and generally spaced apart from the thermal shield and is positioned outside of and generally spaced apart from the superconductive coil assembly. The inner support cylinder has a first end rigidly connected to the thermal shield near the second end of the outer support cylinder and has a second end located longitudinally between the first and second ends of the outer support cylinder and rigidly connected to the superconductive coil assembly.

Problems can occur, however, with some designs of tube suspension systems at cryogenic temperatures. For instance, high stresses can result at joints between dissimilar materials of the tube suspension system and the metallic magnet components which severely limit the load carrying capacity of the tube suspension system. Also, large differential thermal contraction between the tube suspension system and the metallic magnet components can cause failure of the tube suspension system.

Consequently, a need exists for innovation with respect to tube suspension systems for superconductive magnets which will provide a solution to the aforementioned problems.

BRIEF SUMMARY OF THE INVENTION

The present invention provides a tube suspension assembly designed to satisfy the aforementioned need. The tube suspension assembly of the present invention provided for a superconductive magnet avoids the problems of high stresses and large differential thermal contraction between the cryogenic vessel, thermal shield and vacuum enclosure of the magnet by forming a sliding joint with the cryogenic vessel that allows both radial and axial movement of the cryogenic vessel relative to the thermal shield and vacuum enclosure during cooldown of the cryogenic vessel from ambient to cryogenic temperatures.

In an embodiment of the present invention, a tube suspension assembly is provided for superconductive magnets. The superconductive magnet has a longitudinal central axis and includes a superconductive coil assembly having a cryogenic vessel, a thermal shield enclosing the cryogenic vessel, and a vacuum enclosure enclosing the thermal shield. The cryogenic vessel, thermal shield and vacuum enclosure have annular shells radially spaced apart from one another with reference to the longitudinal axis and coaxially aligned with the longitudinal axis. The tube suspension assembly comprises a plurality of tubes located between respective ones of the cryogenic vessel, thermal shield and vacuum enclosure and axially overlapped and interconnected with one another and with the cyrogenic vessel, thermal shield and vacuum enclosure such that the plurality of tubes of the tube suspension assembly supports the cryogenic vessel and thermal shield on the vacuum enclosure. One of the tubes has an end forming a sliding joint with the cryogenic vessel that allows both radial and axial movement of the cryogenic vessel relative to the thermal shield and vacuum enclosure during cooldown of the cryogenic vessel from ambient to cryogenic temperatures as the tube suspension assembly supports the cryogenic vessel and thermal shield on the vacuum enclosure.

More particularly, the plurality of tubes includes a first tube, a second tube and a middle tube between the first and second tubes. The tubes are concentrically arranged with one another and with the longitudinal central axis of the magnet. The first tube is located between the vacuum enclosure and thermal shield and interconnects the vacuum enclosure with the middle tube. The second tube is located between the cryogenic vessel and thermal shield and interconnects the cryogenic vessel with the middle tube. The second tube has the one end forming the sliding joint with the cryogenic vessel. The middle tube is located between and overlapped with axially displaced inner and outer shell portions of the thermal shield and interconnects the inner and outer shell portions of the thermal shield. The middle tube also interconnects the first tube with the second tube.

BRIEF DESCRIPTION OF THE DRAWINGS

FIG. 1 is a schematic side elevational view of an open MRI magnet employing a sliding joint tube suspension assembly of the present invention.

FIG. 2 is a fragmentary axial sectional view of the assembly, on a larger scale than in FIG. 1.

FIG. 5 is a fragmentary axial sectional view, on a larger scale than in FIG. 2, of a middle tube of the assembly.

DETAILED DESCRIPTION OF THE INVENTION

Figure 3:
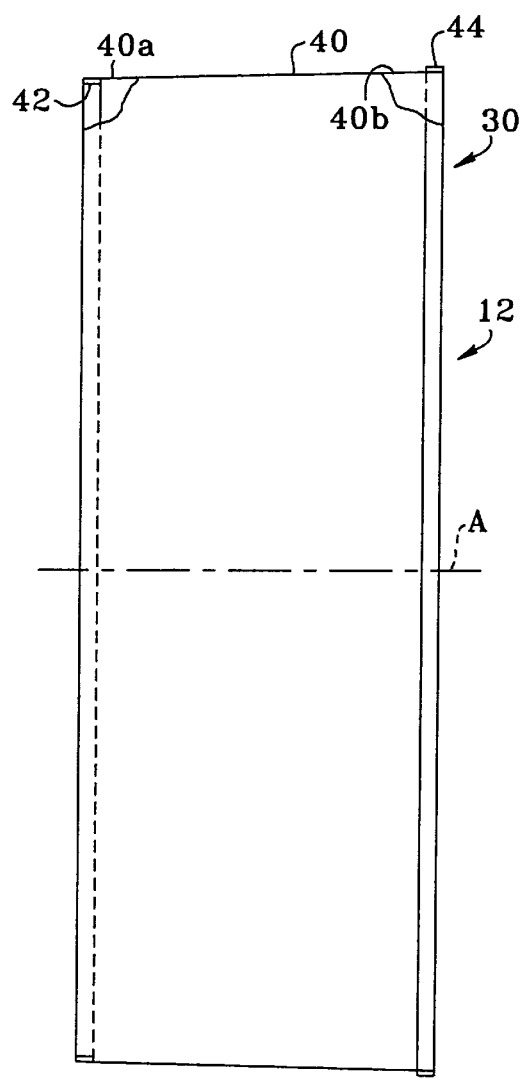
FIG. 3 is a side elevational view, on a smaller scale than in FIG. 2, of an inner tube of the assembly.
Figure 4:
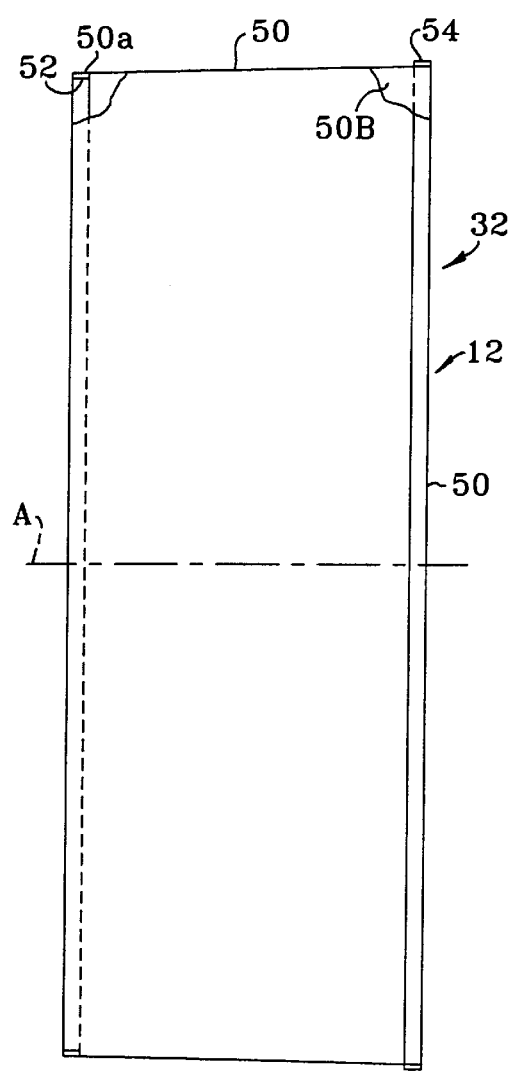
FIG. 4 is a side elevational view, on a smaller scale than in FIG. 2, of an outer tube of the assembly

Referring now to the drawings and particularly to FIG. 1, there is illustrated an open magnetic resonance imaging (MRI) superconductive magnet, generally designated 10, employing a sliding joint tube suspension assembly 12 of the present invention. The superconductive magnet 10 has a longitudinal central axis A and includes a superconductive coil assembly 14 at cryogenic temperature, a thermal shield 16 enclosing the coil assembly 14 and a vacuum enclosure 18 at ambient temperature enclosing the thermal shield 16.

The coil assembly 14, thermal shield 16 and vacuum enclosure 18 are radially spaced from one another with reference to the longitudinal axis A and are coaxially aligned with the longitudinal axis A. The coil assembly 14 includes a cryogenic vessel 20 containing a cryogenic fluid 22 and superconductive coils 24. The vacuum enclosure 18 has a pair of spaced central bores 26 aligned with one another along the longitudinal axis A. The vacuum enclosure 18, thermal shield 16 and cryogenic vessel 20 are in the form of tubular shells of annularly cylindrical configurations.

An example of an open MRI magnet is shown and described in greater detail in U.S. Pat. No. 5,563,566 to Laskaris et al. which is assigned to the same assignee as the present invention. While the suspension assembly 12 of the present invention is shown and described in conjunction with the open-type MRI magnet 10, it is equally adaptable for use in conjunction with a closed-type MRI magnet, an example of which is found in aforecited U.S. Pat. No. 5,530,413.

Figure 6A:
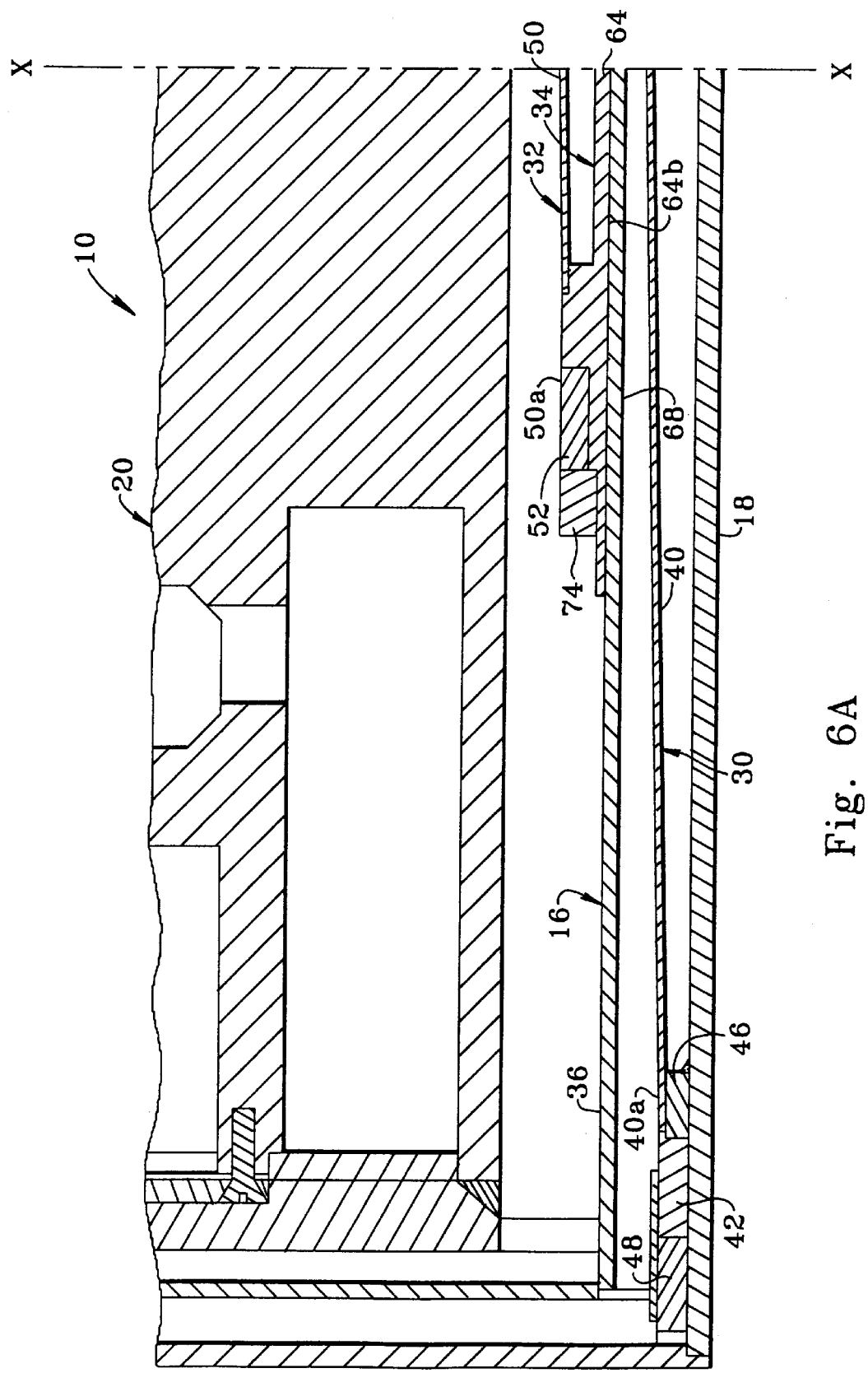
FIGS. 6A and 6B when placed together along line X—X constitute a fragmentary axial sectional view of the assembly on a larger scale than in FIG. 2.
Figure 6B:
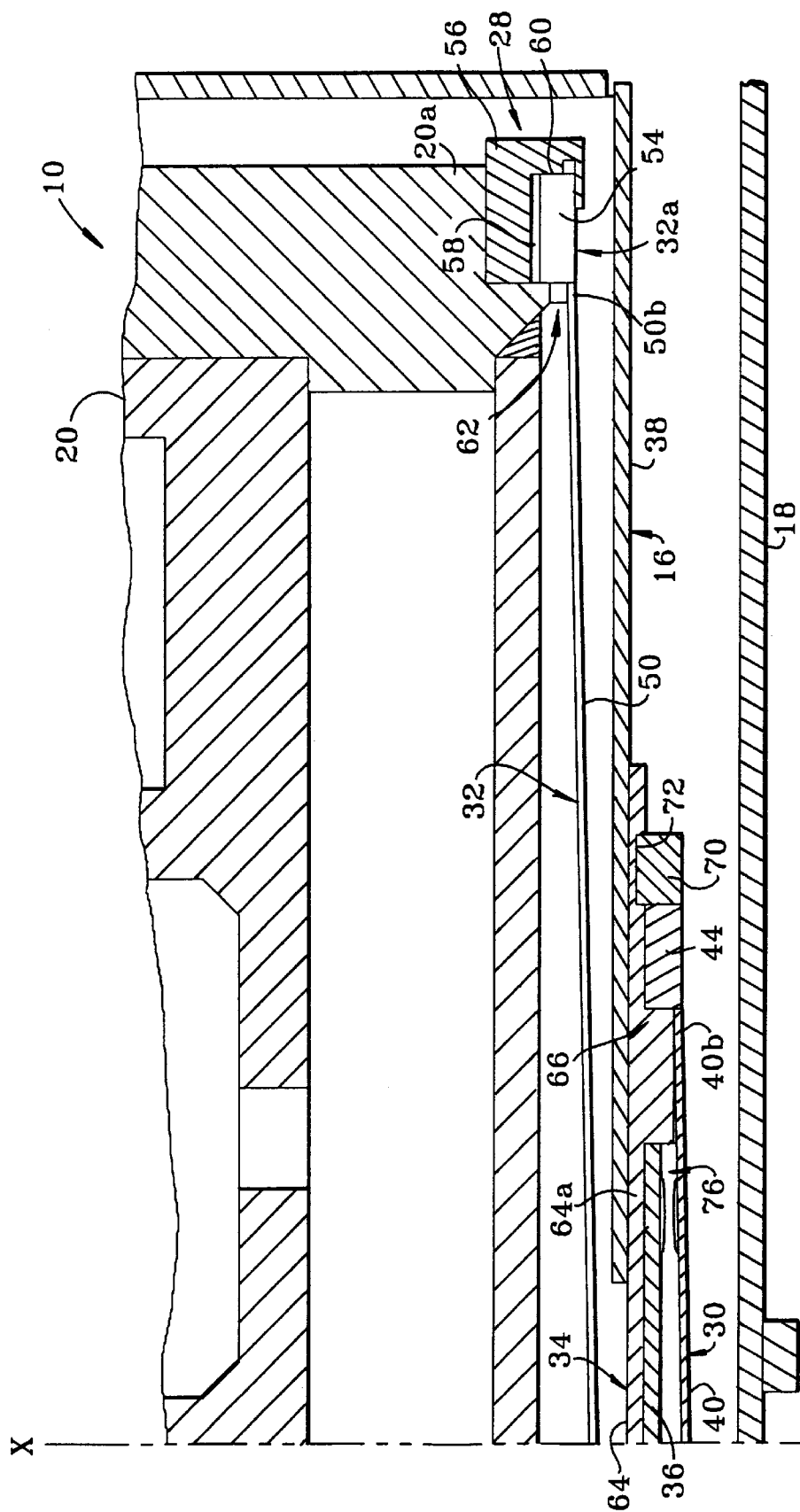

Referring now to FIGS. 2, 6A and 6B, there is illustrated the tube suspension assembly 12 of the present invention employed between the cryogenic vessel 20, thermal shield 16 and vacuum enclosure 18, respectively, so as to provide support of the cryogenic vessel 20 and thermal shield 16 on the vacuum enclosure 18 and a sliding joint, generally designated 28, which allows both radial and axial movement of the cryogenic vessel 20 and thus the coil assembly 14 relative to the thermal shield 16 and vacuum enclosure 18 during cooldown of the cryogenic vessel 20 from ambient to cryogenic temperatures (and during warmup of the cryogenic vessel 20 from cryogenic to ambient temperatures) as the tube suspension assembly 12 supports the cryogenic vessel 20 and thermal shield 16 on the vacuum enclosure 18. The tube suspension assembly 12, more particularly, includes a plurality of tubes, namely, an inner tube 30, an outer tube 32 and a middle tube 34, interconnected to and axially overlapped with each other and substantially concentrically arranged with one another and with the longitudinal central axis A of the magnet 10. Each of the concentric inner, outer and middle tubes 30, 32, 34 is preferably made of a suitable fiber reinforced composite material. The inner tube 30 is located between the vacuum enclosure 18 and the thermal shield 16 and interconnects the vacuum enclosure 18 with the middle tube 34. The thermal shield 16 is provided in the form of separate, axially displaced and overlapped, inner and outer shell portions 36, 38. The middle tube 34 is located between and overlapped with the inner and outer shells 36, 38 of the thermal shield 16 and interconnects the inner and outer shell portions 36, 38 of the thermal shield 16 and also interconnects the inner tube 30 with the outer tube 32. The outer tube 32 is located between the thermal shield 16 and the cryogenic vessel 20 of the coil assembly 14 and interconnects the middle tube 34 with the cryogenic vessel 20. One of the tubes, namely, the outer tube 32 has an end 32a forming the sliding joint 28 with an end 20a of the cryogenic vessel 20 that allows both radial and axial movement of the cryogenic vessel 20 relative to tube suspension assembly 12 and thus relative to the thermal shield 16 and the vacuum enclosure 18 during the cooldown of the cryogenic vessel 20 from the ambient to cryogenic temperatures (and during warmup of the cryogenic vessel 20 from cryogenic to ambient temperatures).

Referring to FIGS. 2, 3, 6A and 6B, more particularly, the inner tube 30 of the suspension assembly 12 has a shell-like body 40 of generally conical configuration and interior and exterior flanges 42, 44 formed on the opposite ends 40a, 40b of the body 40. The interior flange 42 at the one end 40a of the body 40 of the inner tube 30 is bonded to the vacuum enclosure 18 and captured between two axially spaced rings 46, 48 attached on the adjacent portion of the vacuum enclosure 18 for axial support of the inner tube 30 by the vacuum enclosure 18. The exterior flange 44 at the other end 40b of the body 40 of the inner tube 30 is bonded to the middle tube 34.

Referring to FIGS. 2, 4, 6A and 6B, the outer tube 32 has a shell-like body 50 of generally conical configuration and internal and external flanges 52, 54 formed on the opposite ends 50a, 50b of the body 50 of the outer tube 32. The internal flange 52 of the body 50 of the outer tube 32 is bonded to the middle tube 34. The external flange 54 of the body 50 of the outer tube 32 is captured by a split ring 56 that fits to the inside diameter of the external flange 54 to form the sliding joint 28 which has a set radial gap 58 on the outside diameter of the external flange 54 and a set axial gap 60 at the ambient temperature but which is substantially eliminated at the cryogenic temperature. The split ring 56 is firmly secured to the cryogenic vessel 20. The axial gap 60 is set so that it is reduced to nearly zero at cryogenic temperature, and the external flange 54 of the end 32a of the outer tube 32 is free to slide relative to the split ring 56 without axial interference. The radial gap 58 is set so that the split ring 56 interferes at cryogenic temperatures with the external flange 54 of the outer tube 32 so that the bending stresses at the tube/flange corner 62 are minimum, and the radial stress is compressive. This ensures that the external flange 54 will not peel off from the outer tube 32 during loading. Sliding tests were performed on the sliding joint 28 formed by the external flange 54 of the outer tube 32 with the split ring 56 which demonstrated that the joint 28 is free to slide during cooldown from ambient to cryogenic temperatures.

Referring to FIGS. 2, 5, 6A and 6B, the middle tube 34 of the suspension assembly 12 has a generally shell-like body 64 of substantially cylindrical configuration and interior and exterior step portions 66, 68 formed on opposite ends 64a, 64b of the body 64 of the middle tube 34. The interior step portion 66 formed on the one end 64a of the body 64 of the middle tube 34 receives and engages the exterior flange 44 of the inner tube 30. The exterior step portion 68 formed on the other end 64b of the body 64 of the middle tube 34 receives and engages the interior flange 52 of the outer tube 32. A split ring 70 is bonded to the middle tube 34 within a groove 72 of the interior step portion 66 next to the exterior flange 44 of the inner tube 30 so as to secure the exterior flange 44 against axial movement. The internal flange 52 of the outer tube 32 is captured between the exterior step portion 68 of the middle tube 34 and another split ring 74 bonded to the middle tube 34 next to the internal flange 52 of the outer tube 32.

As seen in FIGS. 2, 6A and 6B and mentioned above, the thermal shield 16 is made of the inner and outer shell portions 36, 38. The outer shell portion 38 of the thermal shield 16 is bonded to outside diameter or exterior side of the middle tube 34 at the one end 64a of the body 64 thereof. The inner shell portion 36 of the thermal shield 16 is slit axially at one end 36a and some slits are bolted and bonded to the middle tube 34 and outer shell portion 38 of the thermal shield 16 to provide a joint 76 as seen in FIG. 6B. The thermal shield joint 76 results in a shrink fit with the middle/inner tube joint at cryogenic temperatures, which minimizes the radial stresses of the inner tube/exterior flange corner to prevent peeling of the exterior flange 44 during loading.

The characterization of the tubes 30, 32 of the tube suspension assembly 12 respectively as "inner" and "outer"

tubes is only because of their relative radial positions with respect to the axis A in the arrangement illustrated in the drawings wherein the tube suspension assembly 12 is employed between the radially inner walls of the vacuum enclosure 18, thermal shield 16 and cryogenic vessel 20. When the tube suspension assembly 12 is employed between the radially outer walls of the vacuum enclosure 18, thermal shield 16 and cryogenic vessel 20, the relative radial positions of the tubes 30, 32 with respect to the axis A would be reversed and they would then be characterized as the "outer" and "inner" respectively.

It is thought that the present invention and its advantages will be understood from the foregoing description and it will be apparent that various changes may be made thereto without departing from the spirit and scope of the invention or sacrificing all of its material advantages, the above-described embodiment(s) being merely exemplary thereof.

We claim:

1. A superconductive magnet, comprising:
    a superconductive coil assembly having a cryogenic vessel;
    a thermal shield enclosing said cryogenic vessel;
    a vacuum enclosure enclosing said thermal shield, said cryogenic vessel, thermal shield and vacuum enclosure having annular shells radially spaced apart from one another with reference to a common longitudinal axis and coaxially aligned with said common longitudinal axis; and
    a tube suspension assembly including a plurality of tubes located between respective ones of said cryogenic vessel, thermal shield and vacuum enclosure and being axially overlapped and interconnected with one another and with said cryogenic vessel, thermal shield and vacuum enclosure such that said plurality of tubes of said tube suspension assembly provides support of said cryogenic vessel and thermal shield on said vacuum enclosure, one of said tubes of said tube suspension assembly having an end forming a sliding joint with said cryogenic vessel that allows both radial and axial movement of said cryogenic vessel relative to said thermal shield and vacuum enclosure during cooldown of said cryogenic vessel from ambient to cryogenic temperatures as said tube suspension assembly supports said cryogenic vessel and thermal shield on said vacuum enclosure.

2. The magnet of claim 1 in which said plurality of tubes includes a first tube, a second tube and a middle tube between said first and second tubes.

3. The magnet of claim 2 in which said thermal shield has axially displaced inner and outer shell portions and said middle tube is located between and overlapped with and interconnects said inner and outer shell portions of said thermal shield.

4. The magnet of claim 2 in which said middle tube interconnects said first tube with said second tube.

5. The magnet of claim 2 in which said tubes are concentrically arranged with one another and with said common longitudinal axis.

6. The magnet of claim 2 in which said second tube is located between said cryogenic vessel and thermal shield and interconnects said cryogenic vessel with said middle tube.

7. The magnet of claim 2 in which said first tube is located between said vacuum enclosure and thermal shield and interconnects said vacuum enclosure with said middle tube.

8. The magnet of claim 7 in which said second tube is located between said cryogenic vessel and thermal shield and interconnects said cryogenic vessel with said middle tube.

9. The magnet of claim 8 in which said second tube has said one end forming said sliding joint with said cryogenic vessel.

10. The magnet of claim 8 in which said thermal shield has axially displaced inner and outer shell portions and said middle tube is located between and overlapped with and interconnects said inner and outer shell portions of said thermal shield and also interconnects said first tube with said second tube.

* * * * *